(12) United States Patent
Park et al.

(10) Patent No.: US 8,174,184 B2
(45) Date of Patent: May 8, 2012

(54) ORGANIC LIGHT EMITTING DIODE WITH ORGANIC MULTI-LAYER STRUCTURE HAVING A NON-LINEAR POTENTIAL DISTRIBUTION

(75) Inventors: Young-Gil Park, Suwon-si (KR); Jung-Un Kim, Suwon-si (KR); Yoon-Soo Lee, Suwon-si (KR); Jae-Hak Lee, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 247 days.

(21) Appl. No.: 12/238,915

(22) Filed: Sep. 26, 2008

(65) Prior Publication Data

US 2009/0085475 A1 Apr. 2, 2009

(30) Foreign Application Priority Data

Sep. 28, 2007 (KR) .................. 10-2007-0097913

(51) Int. Cl.
*H05B 33/00* (2006.01)
*H05B 33/14* (2006.01)
*H01L 51/50* (2006.01)

(52) U.S. Cl. ........... 313/504; 313/506; 428/690; 257/40

(58) Field of Classification Search .......... 313/504–506; 428/690, 917

See application file for complete search history.

(56) References Cited

U.S. PATENT DOCUMENTS

| | | | |
|---|---|---|---|
| 2006/0181199 A1* | 8/2006 | Lee et al. | 313/503 |
| 2006/0199038 A1* | 9/2006 | Lee | 428/690 |
| 2007/0126348 A1* | 6/2007 | Iou | 313/506 |
| 2007/0182320 A1* | 8/2007 | Nakamura | 313/506 |

FOREIGN PATENT DOCUMENTS

| | | |
|---|---|---|
| KR | 2001-60821 | 7/2001 |
| KR | 2007-53240 | 5/2007 |
| KR | 2007-58485 | 6/2007 |
| KR | 2007-59082 | 6/2007 |

OTHER PUBLICATIONS

Martin, S. et al., "The internal electric field distribution in bilayer organic light emitting diodes", Organic Electronics 3, 2002, pp. 129-141.

Tutis, E. et al., "Internal electric field and charge distribution in multilayer organic light-emitting diodes", Journal of Applied Physics, vol. 93, No. 8, Apr. 15, 2003, pp. 4594-4602.

Extended European Search Report dated Jul. 22, 2011 in corresponding European application No. 08253170.8, 5 shts.

Photoelectron Spectroscopic Study of Energy Level Alignment At C12A7:e / Alq3 Interfaces; ICCCI 2006 (Kurashiki, Japan Sep. 6-9, 2006); pp. 1-3.

Sasaki et al.; Mapping of Dopant Concentration in GaAs Semiconductor by Off-axis Phase-shifting Electron Holography; © 2006 American Institute of Physics; Applied Physics Letters 89, 244101 (2006); 3 pages.

Chung et al.; Mean Inner Potentials in Oxidized Germanium Nanowires by Electron Holography; Microsec Microanal 11 (Suppl 2), 2005; © 2005 Microscopy Society of America; pp. 588 and 589.

* cited by examiner

*Primary Examiner* — Sikha Roy

(74) *Attorney, Agent, or Firm* — Christie, Parker & Hale, LLP

(57) ABSTRACT

An organic light emitting diode (OLED) includes an anode, a cathode, and an organic multi-layer structure disposed between the anode and the cathode. The inner potential distribution of the organic multi-layer structure has a non-linear profile.

19 Claims, 3 Drawing Sheets

ORGANIC LIGHT EMITTING DIODE WITH ORGANIC MULTI-LAYER STRUCTURE HAVING A NON-LINEAR POTENTIAL DISTRIBUTION

CROSS-REFERENCE TO RELATED APPLICATIONS

This application claims the benefit of Korean Patent Application No. 2007-97913 filed in the Korean Intellectual Property Office on Sep. 28, 2007, the disclosure of which is incorporated herein by reference.

BACKGROUND OF THE INVENTION

1. Field of the Invention

Aspects of the present invention relate to an organic light emitting diode. More particularly, aspects of the present invention relates to a multi-layer structure of the organic light emitting diode.

2. Description of the Related Art

Among various display panels for a display device, a display panel using an organic light emitting diode (OLED) has been receiving attention according to advances in semiconductor technology.

An active matrix type of OLED display using an organic light emitting diode includes a plurality of pixels arranged on a substrate in a matrix form and thin film transistors (TFTs) disposed at each of the pixels, such that each of the pixels is independently controlled through one of the thin film transistors.

In order to exhibit optimal characteristics of the OLED display, semiconductor elements including a thin film transistor and organic light emitting elements including an anode, a hole injection layer (HIL), a hole transport layer (HTL), an emission layer (EML), an electron transport layer (ETL), an electron injection layer (EIL), and a cathode should have good characteristics and should work well with each other.

Semiconductor elements are being actively studied and advances in technology with respect to semiconductor elements are being applied not only to the OLED displays but also to other technical systems. It would also be desirable to provide significant achievements through the study and development of the organic light emitting elements so that a satisfactory OLED display can be provided to a customer.

The above information disclosed in this Background section is only for enhancement of understanding of the background of the invention and therefore may contain information that does not form the prior art that is already known in this country to a person of ordinary skill in the art.

SUMMARY OF THE INVENTION

Aspects of the present invention provide an organic light emitting diode (OLED) that can provide excellent characteristics with an improved organic multi-layer structure.

In addition, aspects of the present invention provide an OLED display having the OLED.

An organic light emitting diode (OLED) according to an embodiment of the present invention includes an anode, a cathode, and an organic multi-layer structure disposed between the anode and the cathode. A profile of the inner potential distribution of the organic multi-layer structure is non-linear.

According to an aspect of the present invention, the profile may that of a waveform.

According to an aspect of the present invention, the profile may have a section having a positive slope and a section having a negative slope.

According to an aspect of the present invention, the organic multi-layer structure may include a hole injection layer (HIL) that is adjacent to the anode, and the inner potential distribution of the HIL may have a negative slope.

According to an aspect of the present invention, the organic multi-layer structure may include a hole transport layer (HTL) that is adjacent to the HIL, and the inner potential distribution of the HTL may be flat.

According to an aspect of the present invention, the organic multi-layer structure may include an emission layer that is adjacent to the HTL, and the inner potential distribution of the emission layer may include positive and negative slopes.

According to an aspect of the present invention, the organic multi-layer structure may include an electron transport layer (ETL) that is adjacent to the emission layer, and the inner potential distribution of the ETL may have a positive slope.

According to an aspect of the present invention, the organic multi-layer structure may include an EIL that is adjacent to the ETL, and the inner potential distribution with respect to the EIL may have a positive slope.

According to an aspect of the present invention, the organic multi-layer structure may include an HIL and an HTL that are sequentially adjacent to the anode. The inner potential distribution of the HIL may have a negative slope, and the inner potential distribution of the HTL may be flat.

According to an aspect of the present invention, the organic multi-layer structure may include an HIL, an HTL, and an emission layer that are sequentially adjacent to the anode. The inner potential distribution of the HIL may have a negative slope, the inner potential distribution of the HTL may be flat, and the inner potential distribution of the emission layer may include negative and positive slopes.

According to an aspect of the present invention, the organic multi-layer structure may include an HIL, an HTL, an emission layer, and an ETL that are sequentially adjacent to the anode. The inner potential distribution of the HIL may have a negative slope, the inner potential distribution of the HTL may be flat, the inner potential distribution of the emission layer may include negative and positive slopes, and the inner potential distribution of the ETL may have a positive slope.

According to an aspect of the present invention, the organic multi-layer may include an HIL, an HTL, an emission layer, an ETL, and an EIL that are sequentially adjacent to the anode. The inner potential distribution of the HIL may have a negative slope, the inner potential distribution of the HTL may be flat, the inner potential distribution of the emission layer may include negative and positive slopes, the inner potential distribution of the ETL may have a positive slope, and the inner potential distribution of the EIL may have a positive slope.

According to an aspect of the present invention, the inner potential value of to the organic multi-layer may be distributed within a relative value of 1.1 eV.

According to an aspect of the present invention, the inner potential value of the HIL may be distributed within a relative value of 0.3 eV.

According to an aspect of the present invention, the inner potential value of the ETL may be distributed within a relative value of 0.3 eV.

In addition, an embodiment of the present invention provides an OLED display that includes the above-described OLED.

The OLED according to the embodiment of the present invention can have improved characteristics with the organic multi-layer structure having an improved inner potential distribution.

Accordingly, the OLED display having the OLED according to the embodiment of the present invention can provide a high quality image to a customer, with improved light characteristics of the OLED.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
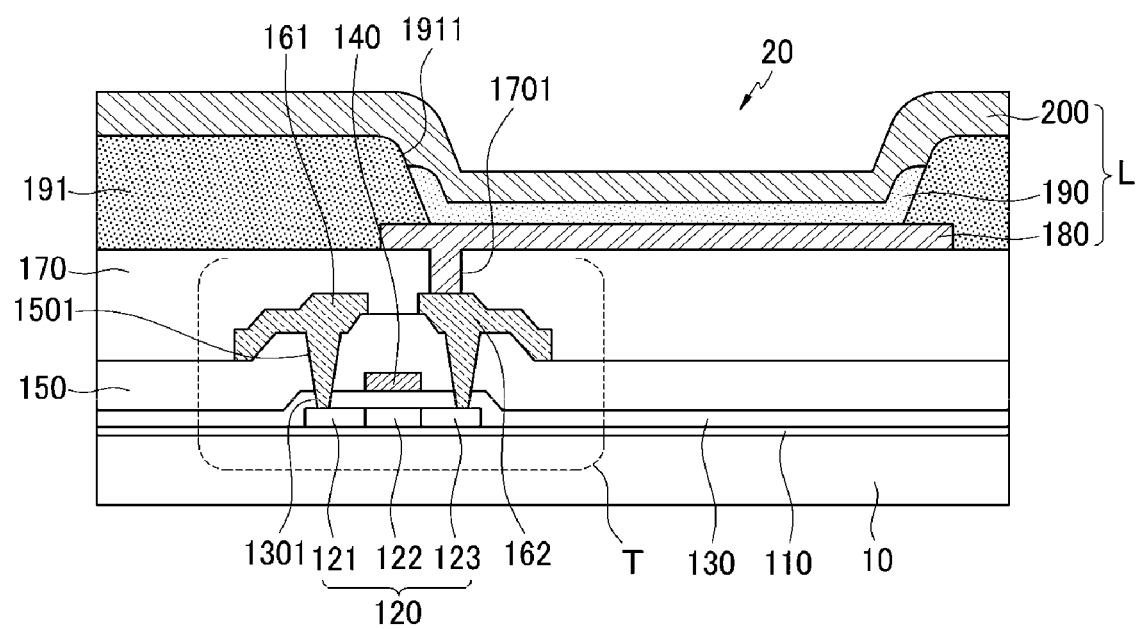
FIG. 1 is a partial cross-sectional view of an organic light emitting diode (OLED) display according to an exemplary embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Accordingly, the drawings and description are to be regarded as illustrative in nature and not restrictive. Like reference numerals designate like elements throughout the specification.

In the drawings, the thickness of layers, films, panels, regions, etc., are exaggerated for clarity. It is to be understood that when an element such as a layer, film, region, or substrate is referred to as being "on" another element, it can be directly on the other element or intervening elements may also be present. In contrast, when an element is referred to as being "directly on" another element, there are no intervening elements present.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" are to be understood to imply the inclusion of stated elements but not the exclusion of any other elements.

FIG. 1 shows a partial cross-sectional view of an organic light emitting diode (OLED) display 20 according to an embodiment of the present invention.

Referring to FIG. 1, the OLED display 20 is formed by arranging pixels that are basic units for displaying an image in a matrix format on a substrate 10. When the OLED display 20 is an active matrix type of OLED display, each pixel includes an organic light emitting diode L that emits light for displaying an image and a thin film transistor T that drives the organic light emitting diode L. The OLED display 20 of FIG. 1 is a top emission type, so that light emitted from the organic light emitting diode L is emitted in an opposite direction of the substrate 10.

Hereinafter, the OLED display 20 will be described in further detail.

A buffer layer 110 is formed on the substrate 10, and the thin film transistor T, which is a semiconductor, is formed on the buffer layer 110. The thin film transistor T includes a semiconductor layer 120 that is formed on the buffer layer 110, a gate electrode 140, a source electrode 161, and a drain electrode 162. The semiconductor layer 120 includes a channel area 122 that is disposed between a source area 121 and a drain area 123 for connection therebetween. A gate insulating layer 130 is formed on the buffer layer 110 to cover the semiconductor layer 120, and the gate electrode 140 is formed on the semiconductor layer 120 interposing the gate insulating layer 130 therebetween. An interlayer insulating layer 150 is formed on the gate insulating layer 130 while covering the gate electrode 140. Here, the gate insulating layer 130 and the interlayer insulating layer 150 respectively include a first contact hole 1301 and a second contact hole 1501. Accordingly, the source area 121 is exposed through the first contact hole 1301 and the second contact hole 1501, and the drain area 123 is exposed similarly. In addition, the source electrode 161 and the drain electrode 162 are electrically connected through the exposed source area 121 and the exposed drain area 123, respectively.

The substrate 10 may be made of an insulating material or a metallic material. The insulating material may include glass or plastic, and the metallic material may include stainless steel (SUS). The buffer layer 110 prevents the spread of impurities of the substrate 10 when the semiconductor layer 120 is formed. As non-limiting examples, the buffer layer 110 may be formed of a silicon nitride layer or a stacked layer of silicon nitride and silicon oxide. The gate electrode 140 may be made of a metal, such as, for example, one of MoW, Al, Cr, and Al/Cr. The source electrode 161 and the drain electrode 162 may be made of a metal such as, for example, Ti/Al or Ti/Al/Ti.

A planarization layer 170 is formed on the interlayer insulating layer 150 to cover the thin film transistor T. A first pixel electrode 180, which is an anode, an organic multi-layer 190, and a second pixel electrode 200, which is a cathode, are sequentially formed to form the organic light emitting diode L on the planarization layer 170.

The first pixel electrode 180 is electrically connected to the drain electrode 162 of the thin film transistor T through a via hole 1701 formed in the planarization layer 170. The first pixel electrode 180 is electrically isolated from a first pixel electrode (not shown) of an adjacent pixel by a pixel defining layer 191, and contacts the organic multi-layer structure 190 through an opening 1911 formed in the organic pixel defining layer 191.

As a non-limiting example, the first pixel electrode 180 may include a first transparent electrode, a conductive reflective layer, and a second transparent electrode that are sequentially stacked. The conductive reflective layer improves electrical conductivity while increasing the luminous efficiency by reflecting light generated from the organic multi-layer structure 190. For example, the conductive reflective layer may be made of aluminum (Al), an aluminum alloy (Al-alloy), silver (Ag), a silver alloy (Ag-alloy), gold (Au), or a gold alloy (Au-alloy). The first and second transparent electrodes may be made of indium tin (ITO) or indium zinc oxide (IZO). The second transparent electrode suppresses oxidization of the conductive reflective layer and improves a work function between the organic multi-layer structure 190 and the reflective layer. The second pixel electrode 200 is formed on a front surface of the substrate 10 to commonly provide a cathode voltage to a plurality of pixels disposed on the substrate 10. The second pixel electrode 200 is formed of a transparent conductive layer according to the light emission direction of the OLED display 20. For example, the second pixel electrode 200 may be made of ITO, IZO, or MgAg.

Figure 2:
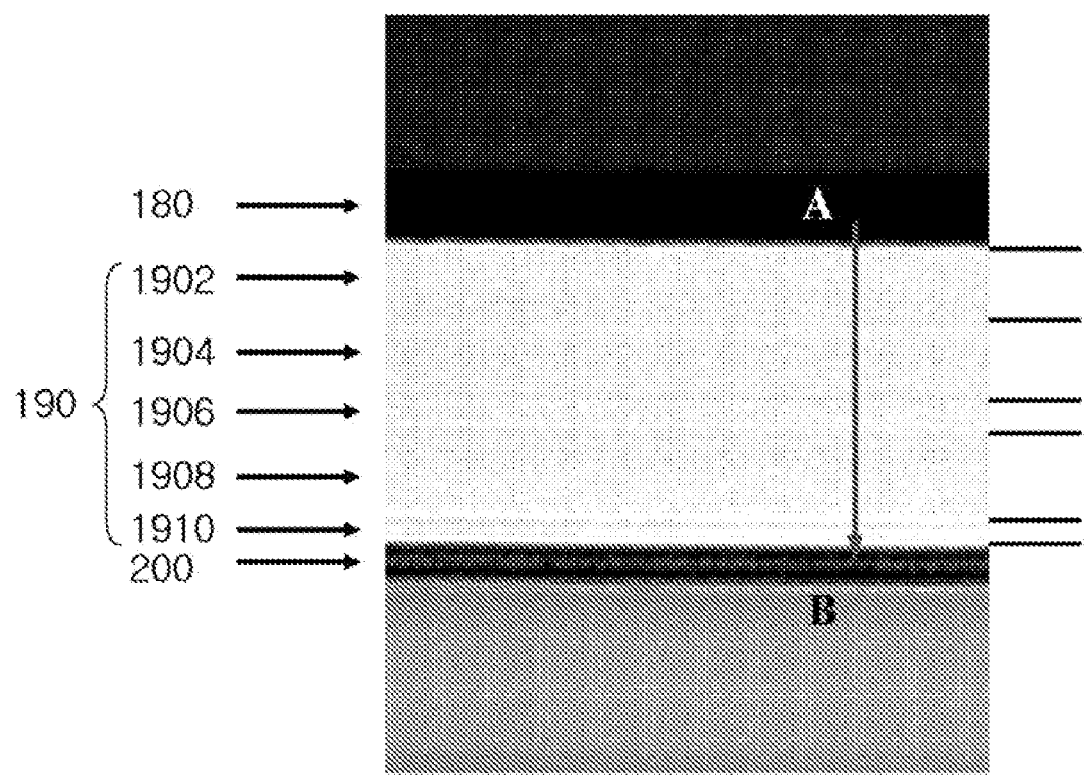
FIG. 2 is a cross-sectional view of the OLED according to the exemplary embodiment of the present invention.

FIG. 2 shows a cross-sectional view of the organic light emitting diode L according to the embodiment of the present invention. Referring to FIG. 2, the organic light emitting diode L includes the anode 180, the cathode 200, and the organic multi-layer structure 190 interposed therebetween. In the present embodiment, the anode 180 is made of ITO and the cathode 200 is made of MgAg, but the anode 180 and the cathode 200 are not limited to these materials.

In addition, in the present embodiment, the organic multi-layer structure 190 may include a hole injection layer (HIL) 1902, a hole transport layer (HTL) 1904, an emission layer (EML) 1906, an electron transport layer (ETL) 1908, and an electron injection layer (EIL) 1910, which are sequentially stacked from the anode 180 to the cathode 200. However, a detailed configuration of the organic multi-layer structure 190 is not limited thereto and other configurations may be used.

Each layer has an appropriate thickness and material as shown in the following table according to the present embodiment. However, it is to be understood that the thickness and material of each layer of the organic multi-layer structure 190 is not limited to the values given in the table.

| Object layer | thickness (nm) | material |
| --- | --- | --- |
| hole injection layer (HIL) | 146.6 | IDE406 |
| hole transport layer (HTL) | 141.6 | EL301 |
| emission layer | 54.6 | Host-BH232, Dopant-BD142 |
| electron transport layer (ETL) | 166.0 | L201 |
| electron injection layer (EIL) | 52.1 | LiQ |

Figure 3:
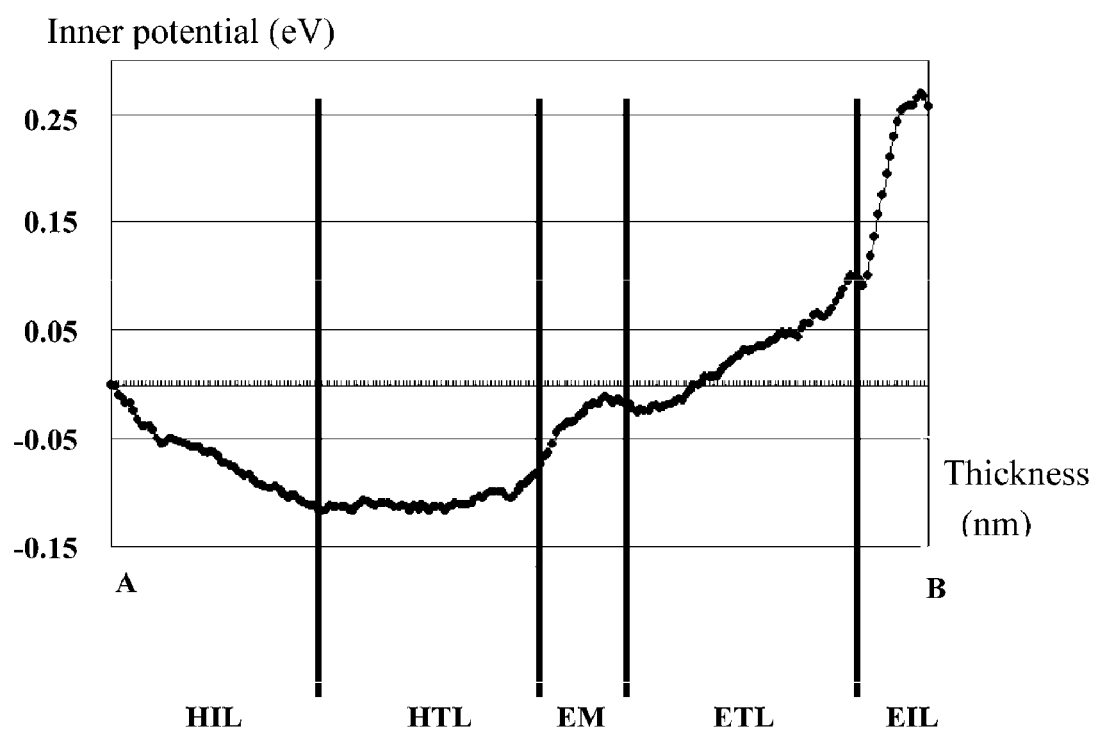
FIG. 3 is a graph showing inner potential distribution of a multi-layer of the OLED according to the exemplary embodiment of the present invention

FIG. 3 is a graph showing an inner potential distribution of the organic multi-layer structure 190 according to the present embodiment. In FIG. 3, the horizontal axis represents the location within the organic multi-layer 190 in a thickness direction (nm) of the organic multi-layer 190, and the vertical axis represents an inner potential (eV) of the organic multi-layer structure 190 according to the indicated location. For convenience of description, the HIL 1902 in the horizontal axis is set as the starting point, and the boundary of each layer is marked as a solid line parallel with the vertical axis.

Referring to FIG. 3, the HIL 1902, the HTL 1904, the EML 1906, the ETL 1908, and the EIL 1910 of the organic multi-layer structure 190 are sequentially disposed along the horizontal axis from the origin, and each layer has an inner potential profile.

First, the profile of the inner potential distribution of the HIL 1902, which is adjacent to the anode 180, has a negative slope. The profile of the inner potential distribution of the hole transport layer (HTL) 1904, which is adjacent to the HIL 1902, is substantially flat.

The profile of the inner potential distribution of emission layer 1906, which is adjacent to the HTL 1904, has a combination of positive and negative slopes. The profile of the inner potential distribution of the electron transport layer (ETL) 1908, which is adjacent to the emission layer 1906, has a positive slope. The profile of the inner potential distribution of the electron injection layer (EIL) 1910, which is adjacent to the ETL 1908, has a positive slope.

Referring to the profiles of the respective layers, the organic multi-layer structures 90 according to the present embodiment is formed with an inner potential profile that has a non-linear shape (e.g., waveform).

In inner potential value of the organic multi-layer structure 190 according to the present embodiment is distributed within a relative value of 1.1 eV. Here, an inner potential value of each layer of the organic multi-layer structure 190 is maintained within an appropriate range. For example, the HIL 1902 and the ETL 1908 can respectively maintain their inner potential distribution differences within a relative value of 0.3 eV.

For measuring the inner potential distribution of the organic multi-layer structure 190 according to the present embodiment, a cross-sectional test samples of a the organic multi-layer structure 190 of the organic light emitting device L was prepared using focus ion beam (FIB) equipment, and the inner potential distribution of the organic multi-layer structure 190 was measured using an electron holography method. Here, the thickness of the cross-section test sample was between 100~400 mm. The inner potential distribution of an organic multi-layer structure according to a comparative example was also measured.

FIB equipment is utilized in a cross-section test sample for transmission electron microscope (TEM) analysis. In addition, electron holography extracts information of an electromagnetic wave that is modulated by an inner potential distribution variation of a solid body and obtains inner potential distribution values of a thin film by using a TEM in which a Biprism is installed. In further detail, a phase reconstruction image is obtained by using a Fourier method or a phase-shift method from a hologram obtained by an electron holography, and a phase shift value inside the organic multi-layer structure 190 is obtained through a Line Profile method. The obtained phase shift value is converted into an inner potential value through the following equation, and inner potential distribution of the organic multi-layer 190 can be evaluated by using the inner potential value.

$$\psi = CVt$$

Here, $\psi$ denotes a phase shift, C denotes a constant depending on the TEM, and t denotes the thickness of a cross-section test sample.

A result of measuring light characteristics of the above-described organic light emitting diode L shows that the light characteristic of the organic light emitting diode L is improved compared to the comparative example. Here, the term "light characteristic" refers to luminous intensity per unit area when the organic light emitting diode L is substantially applied to one device such as an OLED display. That is, the light characteristic relates to the luminance of a display. The comparative example is an organic multi-layer structure that includes the same types of layers as the organic multi-layer structure of the present embodiment, except that a profile of the inner potential distribution of the organic multi-layer structure of the comparative example has a linear shape, unlike the that of the present embodiment.

| | Voltage (V) | Current (mA/cm$^2$) | Luminance (Cd/m$^2$) |
| --- | --- | --- | --- |
| Exemplary embodiment | 6.5 | 0.36 | 16.46 |
| Comparative example | 6.5 | 0.13 | 5.24 |

What is claimed is:

1. An organic light emitting diode (OLED) comprising:
an anode;
a cathode; and
an organic multi-layer structure disposed between the anode and the cathode,
wherein the organic multi-layer structure comprises a hole injection layer (HIL) that is adjacent to the anode, a hole transport layer (HTL) that is adjacent to the HIL, and an emission layer (EML) that is adjacent to the HTL,
wherein the HIL, the HTL, and the EML are configured to provide the organic multi-layer structure with an inner potential distribution having a non-linear profile, comprising a section having a positive slope and a section having a negative slope,
wherein the organic multi-layer structure further comprises an electron transport layer (ETL) that is adjacent to the EML, and an electron injection layer (EIL) that is adjacent to the ETL, and
wherein the EIL comprises LiQ and has a thickness about the same as EML.

2. The OLED of claim 1, wherein the non-linear profile is a waveform.

3. The OLED of claim 1,
wherein an inner potential distribution of the HIL has a negative slope.

4. The OLED of claim 3,
wherein each of the thickness of the HIL and the thickness of the HTL is about 150 nanometers (nm) and the thickness of the EML is about 50 nm, and
wherein an inner potential distribution of the HTL is flat.

5. The OLED of claim 4,
wherein an inner potential distribution of the EML has positive and negative slopes.

6. The OLED of claim 5,
wherein the HIL, the HTL, the EML, the ETL, and the EIL are sequentially adjacent to the anode,
wherein the HIL, the HTL, the EML, the ETL, and the EIL are configured to provide the organic multi-layer structure with the inner potential distribution having the non-linear profile,
wherein a thickness of the ETL is about 150 nm and a thickness of the EIL is about 50 nm, and
wherein an inner potential distribution of the ETL has a positive slope, and an inner potential distribution of the EIL has a positive slope.

7. An organic light emitting display comprising the OLED of claim 6.

8. The OLED of claim 4,
wherein the HIL, the HTL, the EML, and the ETL are sequentially adjacent to the anode,
wherein the HIL, the HTL, the EML, and the ETL are configured to provide the organic multi-layer structure with the inner potential distribution having the non-linear profile,
wherein a thickness of the ETL is about 150 nm, and
wherein an inner potential distribution of the EML has positive and negative slopes, and an inner potential distribution of the ETL has a positive slope.

9. An organic light emitting display comprising the OLED of claim 8.

10. The OLED of claim 3,
wherein the HIL, the HTL, and the EML are sequentially adjacent to the anode, and
wherein an inner potential distribution of the HTL is flat, and an inner potential distribution of the emission layer has positive and negative slopes.

11. An organic light emitting display comprising the OLED of claim 10.

12. The OLED of claim 1,
wherein a thickness of the ETL is greater than the thickness of the EML,
wherein the HIL, the HTL, the EML, and the ETL are configured to provide the organic multi-layer structure with the inner potential distribution having the non-linear profile, and
wherein an inner potential distribution of the HIL has a negative slope, an inner potential distribution of the HTL is flat, an inner potential distribution of the EML has positive and negative slopes, and an inner potential distribution of the ETL has a positive slope.

13. The OLED of claim 12,
wherein each of the thickness of the HIL, the thickness of the HTL, and the thickness of the ETL is greater than a thickness of the EIL, wherein the HIL, the HTL, the EML, the ETL, and the EIL are configured to provide the organic multi-layer structure with the inner potential distribution having the non-linear profile, and wherein an inner potential distribution of the EIL has a positive slope.

14. The OLED of claim 12, wherein an inner potential value of the ETL is distributed within a relative value of 0.3 eV.

15. The OLED of claim 1,
wherein the HIL and the HTL are sequentially adjacent to the anode, and
wherein an inner potential distribution of the HIL has a negative slope, an inner potential distribution of the HTL is flat, and an inner potential distribution of the EML has positive and negative slopes.

16. An organic light emitting display comprising the OLED of claim 15.

17. The OLED of claim 1, wherein an inner potential value of the organic multi-layer structure is distributed within a relative value of 1.1 eV.

18. The OLED of claim 1, wherein an inner potential value of the HIL is distributed within a relative value of 0.3 eV.

19. An organic light emitting display comprising the OLED of claim 1.

* * * * *